(12) United States Patent
Hanna (10) Patent No.: US 12,124,738 B2
(45) Date of Patent: Oct. 22, 2024

(54) ADDRESS VERIFICATION AT A MEMORY SYSTEM

(71) Applicant: Micron Technology, Inc., Boise, ID (US)

(72) Inventor: Stephen Hanna, Fort Collins, CO (US)

(73) Assignee: Micron Technology, Inc., Boise, ID (US)

( * ) Notice: Subject to any disclaimer, the term of this patent is extended or adjusted under 35 U.S.C. 154(b) by 59 days.

(21) Appl. No.: 17/883,191

(22) Filed: Aug. 8, 2022

(65) Prior Publication Data

US 2024/0045617 A1    Feb. 8, 2024

(51) Int. Cl.
     *G06F 3/06*      (2006.01)
(52) U.S. Cl.
     CPC .......... *G06F 3/0659* (2013.01); *G06F 3/0604* (2013.01); *G06F 3/0619* (2013.01)
(58) Field of Classification Search
     CPC .............................. G06F 3/0659; G06F 3/0604
     See application file for complete search history.

(56) References Cited

U.S. PATENT DOCUMENTS

| | | | |
|---|---|---|---|
| 2009/0037782 A1* | 2/2009 | Hughes | G11C 29/02 714/53 |
| 2019/0065396 A1* | 2/2019 | Troia | G06F 3/0688 |
| 2019/0065397 A1* | 2/2019 | Troia | G06F 11/1016 |

* cited by examiner

*Primary Examiner* — Gary W. Cygiel
(74) *Attorney, Agent, or Firm* — Holland & Hart LLP (57) ABSTRACT

Methods, systems, and devices for address verification at a memory system are described. A memory system may determine an address identifier based on a received read command and maintain the determined address identifier in a protected state to validate a subsequent read operation. For example, the memory system may store the determined address identifier in a first memory array, separate from a second memory array that is read from in response to the read command. The memory system may also extract an address identifier from memory cells being read in response to the read command, which may include decoding or other interpreting operations performed on information read from the memory cells. The address identifier extracted from the memory cells may be compared with the address identifier determined from the read command and maintained in the protected state, which may support a determination of how to respond to the read command.

25 Claims, 4 Drawing Sheets

ADDRESS VERIFICATION AT A MEMORY SYSTEM

FIELD OF TECHNOLOGY

The following relates to one or more systems for memory, including address verification at a memory system.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

In some memory implementations, a memory system may receive a command (e.g., a read command) to read data from an array of memory cells, and a portion of the memory system may determine a set of one or more memory cells for a read operation based on an address identifier (ID) (e.g., a logical block address (LBA)) associated with the command. Some techniques may validate such a read operation by performing a comparison associated with a first address ID that is used to determine the set of memory cells for the read operation and a second address ID that is indicated by the set of memory cells themselves (e.g., an address ID stored in the set memory cells, an address ID associated with an encoding of data stored in the set of memory cells). For example, if a cyclic redundancy check (CRC) of the first address ID and a CRC of the second address ID are equal, or otherwise indicate a correspondence, the memory system may proceed with forwarding data associated with the set of memory cells in response to the command. However, such techniques may not consider circumstances in which the address ID that is used to determine the set of memory cells does not correspond to an address ID that is associated with the command (e.g., due to corruption between receiving the command and determining a set of memory cells for a read operation, such as a corruption during signaling between portions of the memory system), which may be associated with reading an incorrect set of memory cells but satisfying an address ID comparison.

In accordance with examples as disclosed herein, a memory system may determine an address ID based on a received read command and maintain the determined address ID in a protected state to support improved techniques for validating a subsequent read operation. For example, the memory system may store the determined address ID in a first memory array (e.g., a buffer, a cache), separate from a second memory array that is read from in response to the read command (e.g., an array storing the data being requested by the read command), which may be performed in a relatively upstream process that limits opportunities for the determined address ID to become corrupted. In some examples, the memory system may validate the determined address ID itself, such as performing an error control operation (e.g., an error detection operation, an error correction operation) associated with the determined address ID, and the determined address ID may be stored in the first memory array with parity information associated with the error control operation. The memory system may also extract an address ID from memory cells being read in response to the read command, which may include various decoding or other interpreting operations performed on information read from the memory cells. The address ID extracted from the memory cells may be compared with the address ID determined from the read command and maintained in the protected state (e.g., to determine whether the extracted address ID is within a range of the address ID determined from the read command), which may support a determination of how to respond to the read command (e.g., forwarding data associated with the read operation, refraining from forwarding data associated with the read operation, transmitting an error indication). Maintaining address IDs determined from read commands under such protection supports improved reliability of a memory system, such as a greater robustness to circumstances in which address IDs may be corrupted between receiving a read command and performing an associated read operation.

Figure 1:
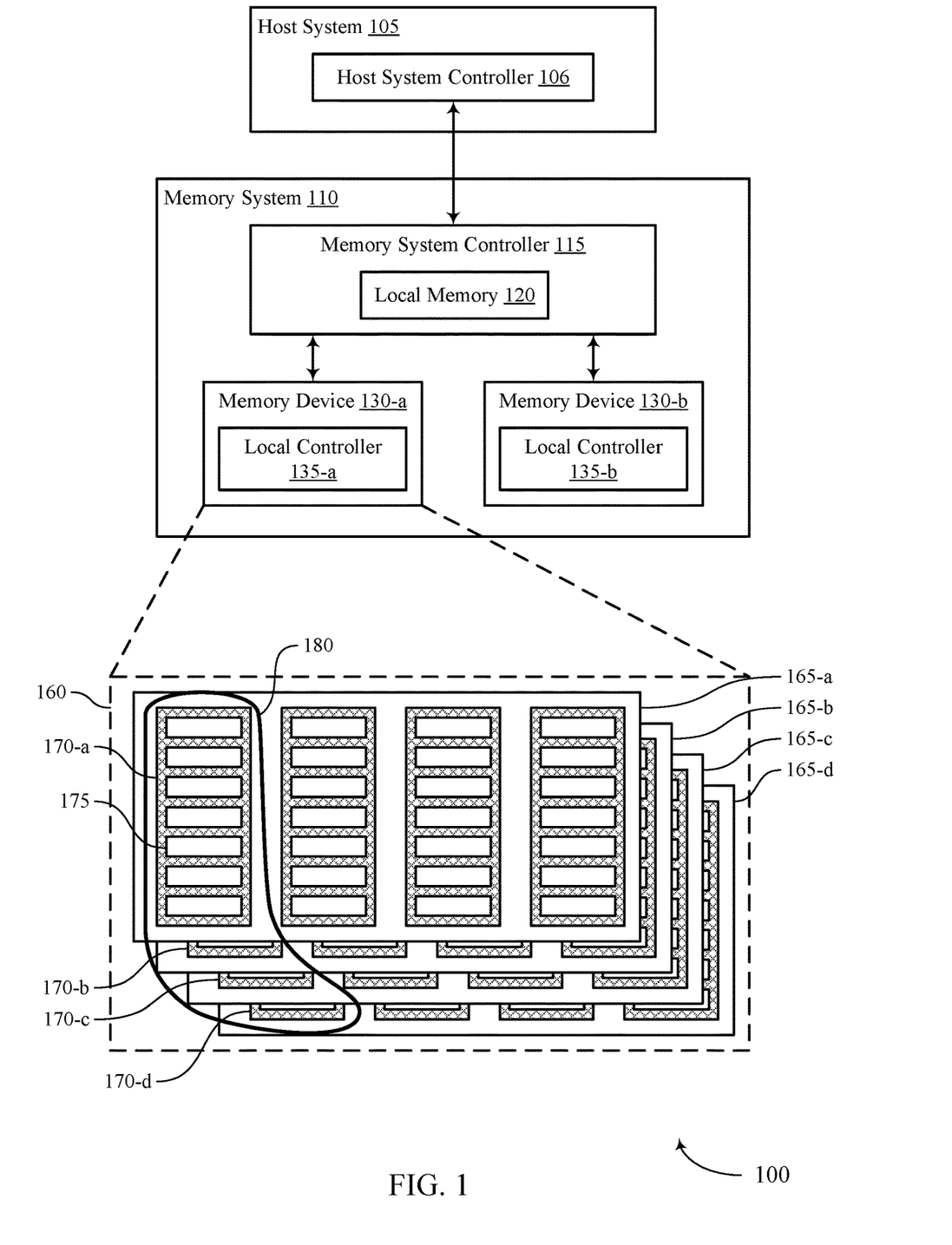
FIGS. 1 and 2 illustrate examples of systems that support address verification at a memory system in accordance with examples as disclosed herein.
Figure 2:
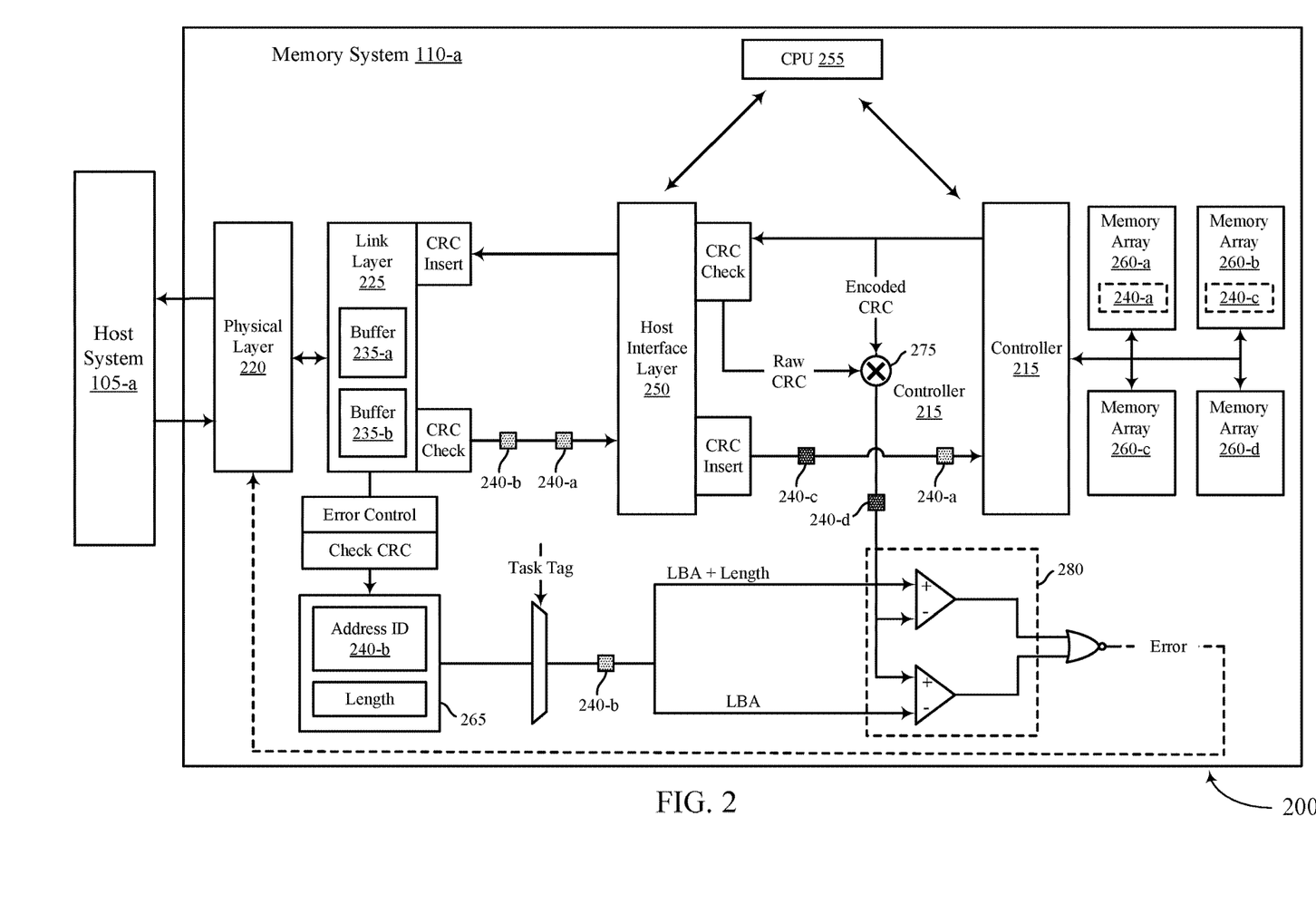

Features of the disclosure are initially described in the context of systems with reference to FIGS. 1 and 2. These and other features of the disclosure are further illustrated by and described in the context of an apparatus diagram and flowcharts that relate to address verification at a memory system with reference to FIGS. 3 and 4.

FIG. 1 illustrates an example of a system 100 that supports address verification at a memory system in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally, or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally, or alternatively, rely on an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EE-PROM), or any combination thereof. Additionally, or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more memory dies 160. A memory die 160 may, in some examples, be a piece of electronics-grade semiconductor cut from a wafer (e.g., a silicon die cut from a silicon wafer). Each memory die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally, or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some examples, a memory system 110 may receive, from the host system 105, a command to read data from the memory system 110 (e.g., from a memory device 130, from an memory die 160), and a portion of the memory system 110 (e.g., a memory system controller 115, a local controller 135) may determine one or more memory cells for a read operation based on an address ID associated with the command. Some techniques may validate such a read operation by comparing (e.g., at a memory system controller 115, at a local controller 135) a first address ID that is used to determine the one or more memory cells for the read operation and a second address ID that is indicated by the one or more memory cells themselves. As one example, a CRC of the first address ID may be compared to a CRC of the second address ID. If the CRCs are equal, the memory system 110 may proceed with forwarding data associated with the set of memory cells to the host system 105 in response to the command. However, such techniques may not consider circumstances in which the address ID that is used to determine the set of memory cells does not correspond to an address ID that is associated with the command, which may be associated with reading an incorrect set of memory cells but satisfying an address ID comparison.

In accordance with examples as disclosed herein, a memory system 110 may determine an address ID based on a received read command and maintain the determined address ID in a protected state. For example, the memory system 110 may store the determined address ID in a first memory array (e.g., of a local memory 120), separate from a second memory array (e.g., of a memory device 130) that is read from in response to the read command. In some examples, the memory system 110 (e.g., a memory system controller 115) may validate the determined address ID by performing an error control operation and subsequently storing the address ID in the first memory array with parity information associated with the error control operation. The memory system 110 may also extract an address ID from memory cells being read in response to the read command (e.g., of the second memory array). The address ID extracted from the memory cells (e.g., from a memory die 160, from a memory device 130) may be compared with the address ID determined from the read command and maintained in the protected state. This comparison may support a determination (e.g., by the memory system 110) of how to respond to the read command from the host system 105. For example, if the address extracted from the memory cell is not within range of the address determined from the read operation, the memory system 110 may refrain from forwarding data associated with the read operation to the host system 105, or may transmit an error indication, or both. Maintaining address IDs determined from read commands under such protection supports improved reliability of the memory system 110, such as a greater robustness to circumstances in which address IDs may be corrupted between receiving a read command and performing an associated read operation.

The system 100 may include any quantity of non-transitory computer readable media that support address verification at a memory system. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

FIG. 2 illustrates an example of a system 200 that supports address verification at a memory system in accordance with examples as disclosed herein. The system 200 may include a host system 105-a and a memory system 110-a, which may be examples of a host system 105 and a memory system 110, respectively, as described with reference to FIG. 1. The memory system 110-a may include a CPU 255, a physical layer 220, a link layer 225, and a host interface layer 250, each of which may be included in or otherwise associated with a memory system controller 115. The memory system 110-a also may include a controller 215, which may be included in or otherwise associated with a memory system controller 115, or a local controller 135, or may be illustrative of functionality that is distributed between a memory system controller 115 and a local controller 135, among other implementations. The memory system 110-a also may include one or more memory arrays 260, which may include NAND memory cells or another type of memory cells of a single memory device 130 or multiple memory devices 130 of the memory system 110-a.

In some examples, the host system 105-a may generate and transmit commands to write data to or read data from one or more memory arrays 260 of the memory system 110-a. For example, the host system 105-a may generate and transmit write commands or read commands to the memory system 110-a. Aspects of a command received by the memory system 110-a may be conveyed via different layers (e.g., service layers, protocol layers, interface layers, component layers) or other processing functionality of the memory system 110-a before or as part of being processed and responded to by the memory system 110-a. For example, as illustrated in FIG. 2, at least a portion of commands received by the memory system 110-a may pass through the physical layer 220, the link layer 225, the host interface layer 250, the CPU 255 (e.g., a CPU layer), or various combination thereof.

Each layer of the memory system 110-a may provide different functionality, and may be configured in accordance with various protocols. For example, the physical layer 220 may support a communication interface between the host system 105-a and the memory system 110-a (e.g., in accordance with an M-PHY protocol). Using the physical layer 220, data and commands can be communicated between the host system 105-a and the memory system 110-a. In some examples, the link layer 225 may be configured for interconnecting components (e.g., semiconductor chips, integrated circuits), such as those supporting a processing pipeline for data units (e.g., in accordance with a Unified Protocol (Unipro) or other protocol). In some examples, the host interface layer 250 may support a checkpoint for data communicated between the host system 105-a and the memory system 110-a.

A command (e.g., a read command, a write command) received by the memory system 110-a may include various parameters, which may be communicated via a command descriptor block (CDB). A CDB may include an operation code, or one or more parameters specific to the command, or any combination thereof, and may be communicated via various indications (e.g., as a quantity of bits, such as a one-byte indication). In some examples, a CDB may include an address ID 240 (e.g., an indication of an address, such as a logical block address (LBA)), a transfer length, or a task tag (e.g., an index associated with an address ID 240, a transfer length, or both), or a combination thereof. In some examples, an address ID 240 and a transfer length may indicate a location of the data in a memory array 260 of the memory system 110-*a* (e.g., a logical or physical indication of where data is to be written, a logical or physical indication of where data is to be read). For example, the address ID may directly or indirectly (e.g., via a logical-to-physical translation) indicate a block 170 or a virtual block 180 associated with one or more memory arrays 260, and the transfer length may indicate a quantity of sets (e.g., sequential sets) of one or more blocks 170 or virtual blocks 180 indicated by the address ID. As an example, an address ID of 10 and a transfer length of 3 may indicate an access (e.g., a read, a write, a transfer) associated with address IDs 10, 11, and 12. A task tag may support a differentiation among commands that may be communicated simultaneously or during overlapping durations. In some examples, the task tag may serve as an index for the command.

In some examples, the memory system 110-*a* may receive a write command from the host system 105-*a* via the physical layer 220, which may indicate to write data to one or more memory arrays 260. The write command may include an address ID 240-*a*, which may include an indication of a logical address (e.g., an LBA) of the write command. In some examples, at least a portion of the write command may be conveyed to the link layer 225, to the host interface layer 250, or the CPU 255 for various processing. For example, the address ID 240-*a* may be translated by the memory system 110-*a* (by the host interface layer 250, by the CPU 255, by the controller 215) to identify one or more physical addresses of the memory arrays 260 for performing a write operation. In some examples, the address ID 240-*a* and a transfer length may be extracted from the CDB of the write command, and one or both of the address ID 240-*a* and the transfer length may be forwarded to the host interface layer 250 and the controller 215.

In some examples, the memory system 110-*a* may receive data (e.g., write data) associated with a write command from the host system 105-*a* via the physical layer 220 and transfer the data to be written to the link layer 225. In some examples, the data may include or be otherwise associated with parity information, such as an attached CRC (e.g., a UFS link CRC). A CRC may be described as a set of bits (e.g., parity bits, CRC bits) appended to data, which may support various error control techniques (e.g., error detection, error correction). At the link layer 225, the memory system 110-*a* may perform a CRC check on the data to be written to evaluate the consistency of the data. For example, at the link layer 225, the memory system 110-*a* may perform a binary division operation on the data using a generator polynomial known to both the memory system 110-*a* and the host system 105-*a*. If no errors exist in the data (e.g., if the remainder of the binary division operation is zero), the memory system 110-*a* may forward the data (e.g., to the host interface layer 250) to be written.

In some examples, the memory system 110-*a* may send write data to the host interface layer 250 in different portions (e.g., portions that correspond to a block 170, a virtual block 180, or an LBA). In some such examples, the memory system 110-*a* may store the write data in a buffer 235-*b* (e.g., a receive (RX) buffer, an L2 RX buffer) before transmitting each portion of the write data to the host interface layer 250. At the host interface layer 250, a CRC (e.g., a Media CRC) may be encoded with the corresponding address ID 240-*a* (e.g., an LBA associated with the write command) and attached to the data. Encoding the CRC with the address ID 240-*a* may include performing an exclusive-or (XOR) operation on the address ID 240-*a* and the CRC. For example, the memory system 110-*a* may compare (e.g., one by one) each bit representing the address ID 240-*a* to each bit representing the CRC and output a bit for each comparison. If the compared bits are the same, the output bit may be a 0 and, if the compared bits are different, the output bit may be a 1. The memory system 110-*a* may forward the write data along with the encoded CRC (e.g., as encoded with the address ID 240-*a*) to the controller 215, and the controller 215 may support performing a write operation on one or more memory arrays 260 to store the data along with the encoded CRC at a memory location (e.g., a location associated with the address ID 240-*a*) in the one or more memory arrays 260. For example, as illustrated, the data associated with the write command may be written to the memory array 260-*a* (e.g., with the CRC encoded using the address ID 240-*a*).

In some examples, the memory system 110-*a* may receive a read command from the host system 105-*a* via the physical layer 220, which may indicate to read data from one or more memory arrays 260. For example, the read command may include an address ID 240-*b* (e.g., which may be extracted from a CDB of the read command), which may include an indication of a logical address (e.g., an LBA) of the read command. In some examples, the address ID 240-*b* may refer to a same address as the address ID 240-*a* (e.g., for the read command to read information corresponding to the write command associated with the address ID 240-*a*). At least a portion of the read command may be conveyed to the link layer 225, to the host interface layer 250, or the CPU 255 for various processing. For example, such an address ID may be translated by the memory system 110-*a* (by the host interface layer 250, by the CPU 255, by the controller 215) to identify one or more physical addresses of the memory arrays 260 for performing a read operation on one of the memory arrays 260. In some examples, a task tag may be used to align the address ID 240-*b* (e.g., an LBA) with a sector read from the memory arrays 260.

In some examples, however, the address ID 240-*b* may be corrupted during various stages of such processing or communication among the different layers or other components of the memory system 110-*a*, which may be associated with a soft error at the memory system 110-*a* (e.g., due to interference, due to alpha particle disturbance, due to computational errors), among other types of errors. For example, although the memory system 110-*a* may initially process the address ID 240-*b*, the memory system may perform further operations (e.g., for identifying a physical address of the memory arrays 260, for performing a read operation on the memory arrays 260) using an address ID 240-*c*, which may be the same as the address ID 240-*b* or may be different than the address ID 240-b*b* (e.g., referring to a different address than the address ID 240-*a*, due to corruption of the address ID 240-*b*). Although illustrating a difference between transmission of an address ID 240 by the link layer 225 and transmission of an address ID 240 by the host interface layer 250, differences between address IDs 240 (e.g., due to corruption) may be experienced at various other stages of communication or processing at the memory system 110-*a*, or combinations thereof.

To support identifying whether the address ID 240-*c* is a corrupted address ID, the memory system 110-*a* may support various techniques for maintaining the address ID 240-*b* in a protected state for subsequent comparison. For example, the memory system 110-*a* may determine (e.g., at the link layer 225, in an LBA capture phase, for each instances of a read command being received at the memory system 110-*a*) at least the address identifier 240-*b*, which may include determining (e.g., snooping) a command universal protocol information unit (UPIU) of the read command. In some examples, such techniques may implemented to obtain the address ID 240-*b*, as well as transfer length, or a task tag, or both (e.g., associated with the read command, associated with the address ID 240-*b*). In some examples, the UPIU may include or otherwise be associated with parity information (e.g., a protection by a link-level CRC check) used to verify fidelity of the data. For example, the UPIU may include an attached CRC (e.g., a UFS Link CRC), which may support various error control techniques (e.g., error detection, error correction). Accordingly, the address ID 240-*b* (e.g., and the transfer length and task tag, where applicable) may include or otherwise be associated with a CRC.

After obtaining the address ID 240-*b* (e.g., and the transfer length and task tag, where applicable) the memory system 110-*a* may perform one or more error control operations (e.g., at or via the link layer 225) using the address ID 240-*b*, which may support maintaining protection over the address ID 240-*b*. For example, the memory system 110-*a* may insert single error correction double error detection (SECDED) information with the obtained address ID 240-*b* (e.g., and the transfer length and task tag, where applicable). In some examples, such techniques may include the memory system 110-*a* appending parity information (e.g., a set of parity bits) with at least the address ID 240-*b*. In some examples (e.g., as part of the one or more error control operations), the memory system 110-*a* may perform a CRC check on the address ID 240-*b* (e.g., and the transfer length and task tag).

In some examples (e.g., after performing the one or more error control operations), the memory system 110-*a* may store at least the address ID 240-*b* in storage location 265 of the memory system 110-*a*. The storage location 265 may be an array of memory cells different than (e.g., separate from) the memory arrays 260, which may include memory cells having a different storage architecture than memory cells of the memory arrays 260. In some examples, the storage location 265 may refer to a portion of a local memory 120, and may refer to a set of SRAM memory cells or other register set. In some examples, the memory system 110-*a* may process multiple read commands concurrently. For example, the memory system 110-*a* may receive a second read command from the host system 105-*a* while processing the read command. In some such examples, the memory system also may store (e.g., at the storage location 265) a transfer length, a task tag, or both corresponding to the read command (e.g., corresponding to the address ID 240-*b*), which may be used for differentiation among commands (e.g., for differentiation among address IDs 240).

In some examples, at least the address ID 240-*c* and, in some examples, the transfer length may be forwarded to the controller 215, which may support performing (e.g., executing) a read command on one or more memory arrays 260. Performing the read operation may include the controller 215 reading data (e.g., one or more portions of data from one or more sectors or translation units (TU)) stored at a memory location determined (e.g., by the controller 215) using the address ID 240-*c*, which may be the same as or different than the address ID 240-*b*. For example, if the address ID 240-*c* is a corrupted address ID, the address ID 240-*c* may be associated with a different address than the address ID 240-*b* (e.g., the address ID of the read command). For the sake of illustration, the address ID 240-*c* may be associated with a physical address of the memory array 260-*b* but, in some other examples, the address ID 240-*c* may be associated with a physical address of the memory array 260-*a* (e.g., whether corrupted or not), among other locations.

Data read in accordance with the address ID 240-*c* may have been stored with an encoded CRC (e.g., a CRC encoded with the address ID 240-*c*). Thus, in some examples, after receiving the data, the host interface layer 250 may support checking a media CRC signature, such as performing a CRC check on the read data (e.g., a binary division on the read data) and writing the read data to a data buffer. In some examples (e.g., after the read data is stored in the data buffer), the memory system 110-*a* may transmit a message to the host interface layer 250, and the host interface layer 250 may read the data and perform a CRC check on the data for accuracy (e.g., to check address IDs 240 for fidelity). Performing the CRC check may include the host interface layer 250 verifying that the encoded CRC (e.g., the CRC of the written data that is encoded with the address ID 240) matches or is equal to an address-encoded CRC that is recalculated at the host interface layer 250 (e.g., based on reading one or more memory arrays 260 in accordance with the address ID 240-*c*).

In some examples, the host interface layer 250 may compare an encoded CRC with a raw CRC (e.g., a CRC recalculated at the host interface layer 250) and extract an address ID 240-*d* (e.g., an extracted address ID) from the data read from the one or more memory arrays 260. For example, the host interface layer 250 may perform an XOR operation 275 using the encoded CRC and the raw CRC to extract the address ID 240-*d*, which may be the same as or different than the address ID 240-*c*. If the XOR operation 275 indicates an error, the memory system 110-*a* (e.g., the controller 215) may identify a corruption of the data read in accordance with the 240-*c*. If the XOR operation 275 does not indicate an error, the memory system 110-*a* may determine that the data read in accordance with the address ID 240-*c* is accurate. However, because the address ID 240-*c* itself may be valid or corrupt (e.g., may be equal to or different than the address ID 240-*b*), the memory system 110 (e.g., the controller 215 or another portion of the memory system 110-*a*) may proceed with further validation operations by forwarding the address ID 240-*d* (e.g., determined based at least in part on reading one or more memory arrays 260 in accordance with the address ID 140-*c*, which may be equal to the address ID 140-*c*) to a comparator 280 (e.g., of the controller 215, of a memory system controller 115).

At the comparator 280, the memory system 110-*a* may compare the address ID 240-*d* with the address ID 240-*b* (e.g., retrieved from the storage location 265, which may be offset or otherwise filtered using a task tag, using reverse coherency logic), which may refer to operations of the comparator 280 that are performed each time sector data is to be conveyed to the host system 105-*a*. For example, if the address ID 240-*d* is within range of the address ID 240-*b*, the memory system 110-*a* (e.g., the host interface layer 250) may verify that the data is associated with a memory location specified by the read command. The range may include the stored address ID 250-*a* and subsequent sequential address IDs 240 specified by the stored transfer length. If there are multiple address IDs 240 (e.g., and transfer lengths, where applicable) stored in the storage location 265, the memory system 110-*a* may identify which address ID 240 (e.g., and transfer length, where applicable) to compare to the address ID 240-*d*) using the task tag.

If the address ID 240-*d* is verified (e.g., as being equal to or within a range of the address ID 240-*b*), the host interface layer 250 may transfer the read data to the host system 105-*a*. For example, the memory system 110-*a* may transfer the read data to the link layer 225. At the link layer 225, the memory system 110-*a* may attach a CRC (e.g., a UFS Link CRC) to the read data and transfer the read data to the host system 105-*a* via the physical layer 220. In some examples, the read data may be transferred to the link layer 225 in different portions. As such, the memory system 110-*a* may store the read data in a buffer 235-*a* (e.g., TX buffer, L2 TX buffer) before transmitting the read data to the host system 105-*a*. Alternatively, if the address ID 240-*d* is not verified (e.g., is not equal to or is outside a range of the address ID 240-*b*), the host interface layer 250 may not transfer the read data to the host system 105-*a*. In some examples, the memory system 110-*a* may transmit an error indication to the host system 105-*a* for cases in which the address ID 240-*d* is not verified. In some examples, the error indication may be fed back through the memory system 110-*a* (e.g., via the physical layer 220).

In accordance with examples as disclosed herein, maintaining the address ID 240-*b* (e.g., determined from a read command) under protection may improve reliability of the memory system 110-*a*, such as providing a greater robustness to circumstances in which address IDs may be corrupted between receiving a read command and performing an associated read operation (e.g., circumstances in which the address ID 240-*c*, the address ID 240-*d*, or both are different than the address ID 240-*b*). Such verification of address IDs 240 may be beneficial for various memory implementations, including safety-critical implementations such as automotive safety applications.

Figure 3:
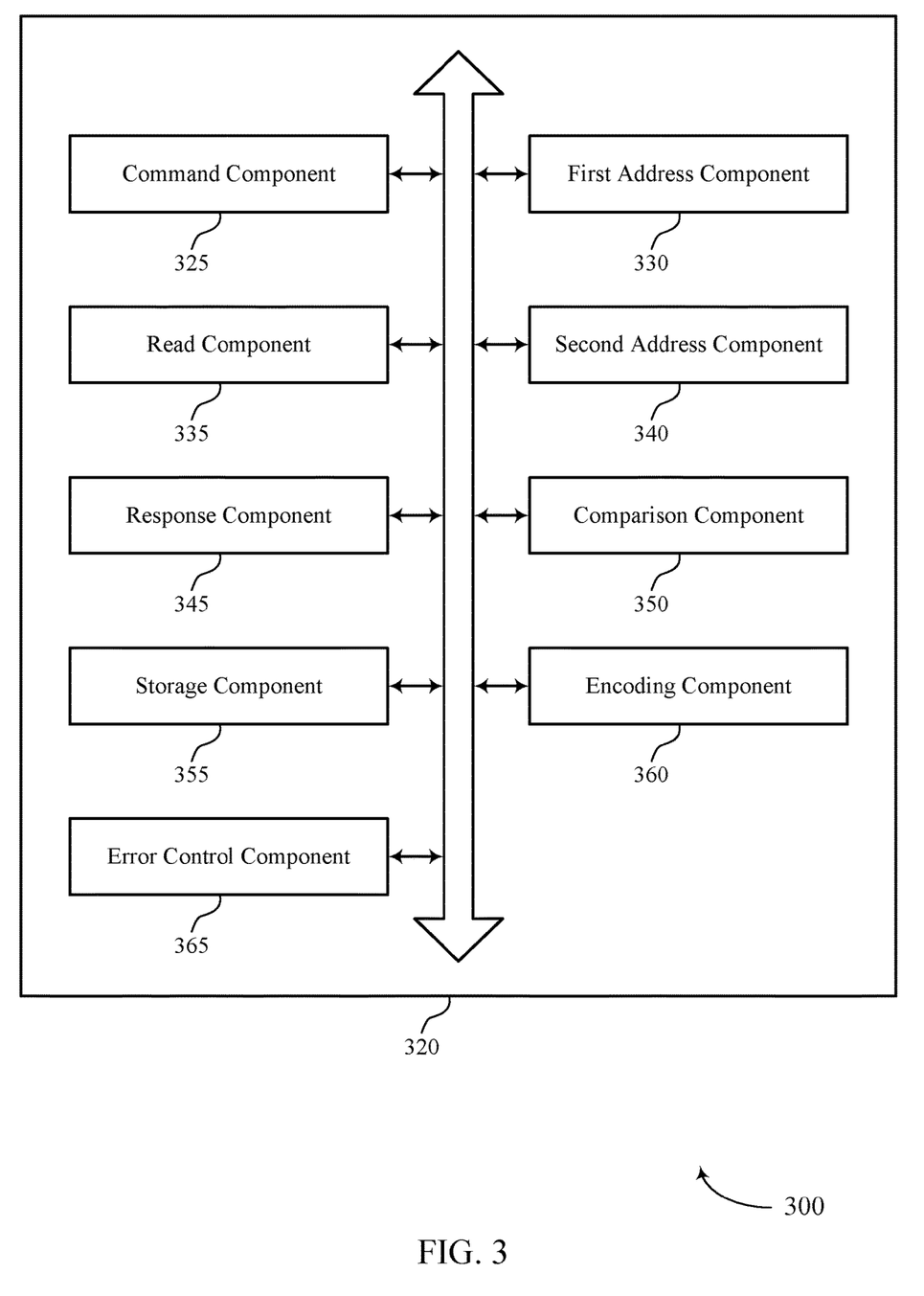
FIG. 3 shows a block diagram of a memory system that supports address verification at a memory system in accordance with examples as disclosed herein.

FIG. 3 shows a block diagram 300 of a memory system 320 that supports address verification in accordance with examples as disclosed herein. The memory system 320 may be an example of aspects of a memory system as described with reference to FIGS. 1 through 2. The memory system 320, or various components thereof, may be an example of means for performing various aspects of address verification at a memory system as described herein. For example, the memory system 320 may include a command component 325, a first address component 330, a read component 335, a second address component 340, a response component 345, a comparison component 350, a storage component 355, an encoding component 360, an error control component 365, or any combination thereof. Each of these components may communicate, directly or indirectly, with one another (e.g., via one or more buses).

The command component 325 may be configured as or otherwise support a means for receiving a command to read data from the memory system 320. The first address component 330 may be configured as or otherwise support a means for determining a first address ID based at least in part on the command. The read component 335 may be configured as or otherwise support a means for reading a plurality of memory cells of a memory array of the memory system 320 based at least in part on the command. The second address component 340 may be configured as or otherwise support a means for determining a second address ID based at least in part on reading the plurality of memory cells. The response component 345 may be configured as or otherwise support a means for responding to the command based at least in part on the second address ID and the first address ID.

In some examples, the comparison component 350 may be configured as or otherwise support a means for determining whether the second address ID is within a range of the first address ID, and the response component 345 responding to the command may be based at least in part on the comparison component 350 determining whether the second address ID is within the range of the first address ID.

In some examples, the first address component 330 may be configured as or otherwise support a means for determining a transfer length and a task tag based at least in part on the command, and the comparison component 350 determining whether the second address ID is within the range of the first address ID may be based at least in part on the transfer length and the task tag.

In some examples, the storage component 355 may be configured as or otherwise support a means for storing an indication of the first address ID, an indication of the transfer length, and an indication of the task tag in a second plurality of memory cells of a second memory array of the memory system 320, and the comparison component 350 determining whether the second address ID is within a range of the first address ID may be based at least in part on the indication of the first address ID, the indication of the transfer length, and the indication of the task tag stored in the second plurality of memory cells.

In some examples, the plurality of memory cells may include NAND memory cells of the memory array and the second plurality of memory cells may include SRAM memory cells of the second memory array.

In some examples, the error control component 365 may be configured as or otherwise support a means for performing an error control operation associated with the indication of the first address ID, the indication of the transfer length, and the indication of the task tag. In some examples, the storage component 355 may be configured as or otherwise support a means for storing the indication of the first address ID, the indication of the transfer length, and the indication of the task tag in the second plurality of memory cells with parity information associated with the error control operation.

In some examples, to support responding to the command, the response component 345 may be configured as or otherwise support a means for transmitting data associated with the plurality of memory cells based at least in part on determining that the second address ID is within the range of the first address ID.

In some examples, to support responding to the command, the response component 345 may be configured as or otherwise support a means for refraining from transmitting data associated with the plurality of memory cells based at least in part on determining that second address ID is not within the range of the first address ID.

In some examples, to support responding to the command, the response component 345 may be configured as or otherwise support a means for transmitting an error indication based at least in part on determining that second address ID is not within the range of the first address ID.

In some examples, to support determining the second address ID, the second address component 340 may be configured as or otherwise support a means for determining a first set of one or more CRC bits based at least in part on the command. In some examples, to support determining the second address ID, the second address component 340 may be configured as or otherwise support a means for determining a second set of one or more CRC bits based at least in part on reading the plurality of memory cells. In some examples, to support determining the second address ID, the second address component 340 may be configured as or otherwise support a means for determining the second address ID based at least in part on performing an XOR operation with the first set of CRC bits and the second set of CRC bits.

In some examples, the command component 325 may be configured as or otherwise support a means for receiving, prior to receiving the command, a second command to write information to the memory system 320. In some examples, the storage component 355 may be configured as or otherwise support a means for storing data to the plurality of memory cells based at least in part on the second command.

In some examples, the encoding component 360 may be configured as or otherwise support a means for encoding the data based at least in part on a third address ID associated with the second command, and storing the data may include storing the encoded data.

Figure 4:
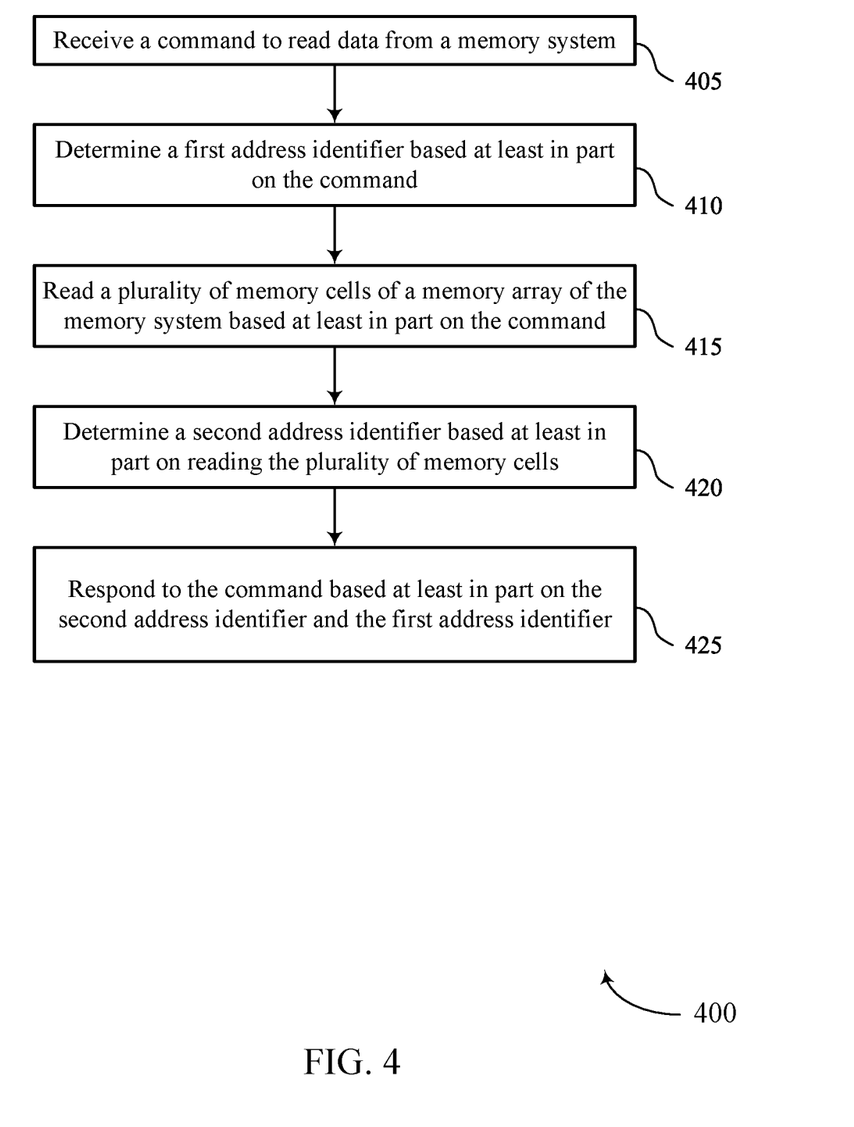
FIG. 4 shows a flowchart illustrating a method or methods that support address verification at a memory system in accordance with examples as disclosed herein.

FIG. 4 shows a flowchart illustrating a method 400 that supports address verification at a memory system in accordance with examples as disclosed herein. The operations of method 400 may be implemented by a memory system or its components as described herein. For example, the operations of method 400 may be performed by a memory system as described with reference to FIGS. 1 through 3. In some examples, a memory system may execute a set of instructions to control the functional elements of the device to perform the described functions. Additionally, or alternatively, the memory system may perform aspects of the described functions using special-purpose hardware.

At 405, the method 400 may include receiving a command to read data from a memory system. The operations of 405 may be performed in accordance with examples as disclosed herein. In some examples, aspects of the operations of 405 may be performed by a command component 325 as described with reference to FIG. 3.

At 410, the method 400 may include determining a first address ID based at least in part on the command. The operations of 410 may be performed in accordance with examples as disclosed herein. In some examples, aspects of the operations of 410 may be performed by a first address component 330 as described with reference to FIG. 3.

At 415, the method 400 may include reading a plurality of memory cells of a memory array of the memory system based at least in part on the command. The operations of 415 may be performed in accordance with examples as disclosed herein. In some examples, aspects of the operations of 415 may be performed by a read component 335 as described with reference to FIG. 3.

At 420, the method 400 may include determining a second address ID based at least in part on reading the plurality of memory cells. The operations of 420 may be performed in accordance with examples as disclosed herein. In some examples, aspects of the operations of 420 may be performed by a second address component 340 as described with reference to FIG. 3.

At 425, the method 400 may include responding to the command based at least in part on the second address ID and the first address ID. The operations of 425 may be performed in accordance with examples as disclosed herein. In some examples, aspects of the operations of 425 may be performed by a response component 345 as described with reference to FIG. 3.

In some examples, an apparatus as described herein may perform a method or methods, such as the method 400. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving a command to read data from a memory system; determining a first address ID based at least in part on the command; reading a plurality of memory cells of a memory array of the memory system based at least in part on the command; determining a second address ID based at least in part on reading the plurality of memory cells; and responding to the command based at least in part on the second address ID and the first address ID.

Aspect 2: The method, apparatus, or non-transitory computer-readable medium of aspect 1, further including operations, features, circuitry, logic, means, or instructions, or any combination thereof for determining whether the second address ID is within a range of the first address ID, where responding to the command is based at least in part on determining whether the second address ID is within the range of the first address ID.

Aspect 3: The method, apparatus, or non-transitory computer-readable medium of aspect 2, further including operations, features, circuitry, logic, means, or instructions, or any combination thereof for determining a transfer length and a task tag based at least in part on the command, where determining whether the second address ID is within the range of the first address ID is based at least in part on the transfer length and the task tag.

Aspect 4: The method, apparatus, or non-transitory computer-readable medium of aspect 3, further including operations, features, circuitry, logic, means, or instructions, or any combination thereof for storing an indication of the first address ID, an indication of the transfer length, and an indication of the task tag in a second plurality of memory cells of a second memory array of the memory system, where determining whether the second address ID is within a range of the first address ID is based at least in part on the indication of the first address ID, the indication of the transfer length, and the indication of the task tag stored in the second plurality of memory cells.

Aspect 5: The method, apparatus, or non-transitory computer-readable medium of aspect 4, where the plurality of memory cells include NAND memory cells of the memory array and the second plurality of memory cells include SRAM memory cells of the second memory array.

Aspect 6: The method, apparatus, or non-transitory computer-readable medium of any of aspects 4 through 5, further including operations, features, circuitry, logic, means, or instructions, or any combination thereof for performing an error control operation associated with the indication of the first address ID, the indication of the transfer length, and the indication of the task tag and storing the indication of the first address ID, the indication of the transfer length, and the indication of the task tag in the second plurality of memory cells with parity information associated with the error control operation.

Aspect 7: The method, apparatus, or non-transitory computer-readable medium of any of aspects 2 through 6, where responding to the command includes operations, features, circuitry, logic, means, or instructions, or any combination thereof for transmitting data associated with the plurality of memory cells based at least in part on determining that the second address ID is within the range of the first address ID.

Aspect 8: The method, apparatus, or non-transitory computer-readable medium of any of aspects 2 through 6, where responding to the command includes operations, features, circuitry, logic, means, or instructions, or any combination thereof for refraining from transmitting data associated with the plurality of memory cells based at least in part on determining that second address ID is not within the range of the first address ID.

Aspect 9: The method, apparatus, or non-transitory computer-readable medium of any of aspects 2 through 6 or 8, where responding to the command includes operations, features, circuitry, logic, means, or instructions, or any combination thereof for transmitting an error indication based at least in part on determining that second address ID is not within the range of the first address ID.

Aspect 10: The method, apparatus, or non-transitory computer-readable medium of any of aspects 1 through 9, where determining the second address ID includes operations, features, circuitry, logic, means, or instructions, or any combination thereof for determining a first set of one or more CRC bits based at least in part on the command; determining a second set of one or more CRC bits based at least in part on reading the plurality of memory cells; and determining the second address ID based at least in part on performing an XOR operation with the first set of CRC bits and the second set of CRC bits.

Aspect 11: The method, apparatus, or non-transitory computer-readable medium of any of aspects 1 through 10, further including operations, features, circuitry, logic, means, or instructions, or any combination thereof for receiving, prior to receiving the command, a second command to write information to the memory system and storing data to the plurality of memory cells based at least in part on the second command.

Aspect 12: The method, apparatus, or non-transitory computer-readable medium of aspect 11, further including operations, features, circuitry, logic, means, or instructions, or any combination thereof for encoding the data based at least in part on a third address ID associated with the second command, where storing the data includes storing the encoded data.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action.

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:
   one or more memory devices; and
   processing circuitry coupled with the one or more memory devices and configured to cause the memory system to:
   receive a command to read data from the memory system;
   determine a first address identifier, a transfer length, and a task tag based at least in part on the command;
   read a plurality of memory cells of a memory array of at least one memory device of the one or more memory devices based at least in part on the command;
   determine a second address identifier based at least in part on reading the plurality of memory cells;
   determine whether the second address identifier is within a range of the first address identifier based at least in part on the transfer length and the task tag; and
   respond to the command based at least in part on determining whether the second address identifier is within the range of the first address identifier.

2. The memory system of claim 1, wherein the processing circuitry is further configured to cause the memory system to:
   store an indication of the first address identifier, an indication of the transfer length, and an indication of the task tag in a second plurality of memory cells of a second memory array of the memory system, wherein determining whether the second address identifier is within the range of the first address identifier is based at least in part on the indication of the first address identifier, the indication of the transfer length, and the indication of the task tag stored in the second plurality of memory cells.

3. The memory system of claim 2, wherein:
the plurality of memory cells comprise not and (NAND) memory cells of the memory array; and
the second plurality of memory cells comprise static random access memory (SRAM) memory cells of the second memory array.

4. The memory system of claim 2, wherein the processing circuitry is further configured to cause the memory system to:
perform an error control operation associated with the indication of the first address identifier, the indication of the transfer length, and the indication of the task tag; and
store the indication of the first address identifier, the indication of the transfer length, and the indication of the task tag in the second plurality of memory cells with parity information associated with the error control operation.

5. The memory system of claim 1, wherein, to respond to the command, the processing circuitry is configured to cause the memory system to:
transmit data associated with the plurality of memory cells based at least in part on determining that the second address identifier is within the range of the first address identifier.

6. The memory system of claim 1, wherein, to respond to the command comprises, the processing circuitry is configured to cause the memory system to:
refrain from transmitting data associated with the plurality of memory cells based at least in part on determining that the second address identifier is not within the range of the first address identifier.

7. The memory system of claim 1, wherein, to respond to the command, the processing circuitry is configured to cause the memory system to:
transmit an error indication based at least in part on determining that the second address identifier is not within the range of the first address identifier.

8. The memory system of claim 1, wherein, to determine the second address identifier, the processing circuitry is configured to cause the memory system to:
determine a first set of one or more cyclic redundancy check bits based at least in part on the command;
determine a second set of one or more cyclic redundancy check bits based at least in part on reading the plurality of memory cells; and
determine the second address identifier based at least in part on performing an exclusive or (XOR) operation with the first set of one or more cyclic redundancy check bits and the second set of one or more cyclic redundancy check bits.

9. The memory system of claim 1, wherein the processing circuitry is further configured to cause the memory system to:
receive, prior to receiving the command, a second command to write information to the memory system; and
store data to the plurality of memory cells based at least in part on the second command.

10. The memory system of claim 9, wherein the processing circuitry is further configured to cause the memory system to:

encode the data based at least in part on a third address identifier associated with the second command, wherein storing the data comprises storing the encoded data.

11. A non-transitory computer-readable medium storing code comprising instructions which, when executed by processing circuitry of an electronic device, cause the electronic device to:
receive a command to read data from a memory system;
determine a first address identifier, a transfer length, and a task tag based at least in part on the command;
read a plurality of memory cells of a memory array of the memory system based at least in part on the command;
determine a second address identifier based at least in part on reading the plurality of memory cells;
determine whether the second address identifier is within a range of the first address identifier based at least in part on the transfer length and the task tag; and
respond to the command based at least in part on determining whether the second address identifier is within the range of the first address identifier.

12. The non-transitory computer-readable medium of claim 11, wherein the instructions, when executed by the processing circuitry of the electronic device, cause the electronic device to:
store an indication of the first address identifier, an indication of the transfer length, and an indication of the task tag in a second plurality of memory cells of a second memory array of the memory system, wherein determining whether the second address identifier is within the range of the first address identifier is based at least in part on the indication of the first address identifier, the indication of the transfer length, and the indication of the task tag stored in the second plurality of memory cells.

13. The non-transitory computer-readable medium of claim 12, wherein:
the plurality of memory cells comprise not and (NAND) memory cells of the memory array; and
the second plurality of memory cells comprise static random access memory (SRAM) memory cells of the second memory array.

14. The non-transitory computer-readable medium of claim 12, wherein the instructions, when executed by the processing circuitry of the electronic device, cause the electronic device to:
perform an error control operation associated with the indication of the first address identifier, the indication of the transfer length, and the indication of the task tag; and
store the indication of the first address identifier, the indication of the transfer length, and the indication of the task tag in the second plurality of memory cells with parity information associated with the error control operation.

15. The non-transitory computer-readable medium of claim 11, wherein the instructions to respond to the command, when executed by the processing circuitry of the electronic device, cause the electronic device to:
transmit data associated with the plurality of memory cells based at least in part on determining that the second address identifier is within the range of the first address identifier.

16. The non-transitory computer-readable medium of claim 11, wherein the instructions to respond to the command, when executed by the processing circuitry of the electronic device, cause the electronic device to:

refrain from transmitting data associated with the plurality of memory cells based at least in part on determining that the second address identifier is not within the range of the first address identifier.

17. The non-transitory computer-readable medium of claim 11, wherein the instructions to respond to the command, when executed by the processing circuitry of the electronic device, cause the electronic device to:
transmit an error indication based at least in part on determining that the second address identifier is not within the range of the first address identifier.

18. The non-transitory computer-readable medium of claim 11, wherein the instructions to determine the second address identifier, when executed by the processing circuitry of the electronic device, cause the electronic device to:
determine a first set of one or more cyclic redundancy check bits based at least in part on the command;
determine a second set of one or more cyclic redundancy check bits based at least in part on reading the plurality of memory cells; and
determine the second address identifier based at least in part on performing an exclusive or (XOR) operation with the first set of one or more cyclic redundancy check bits and the second set of one or more cyclic redundancy check bits.

19. The non-transitory computer-readable medium of claim 11, wherein the instructions, when executed by the processing circuitry of the electronic device, cause the electronic device to:
receive, prior to receiving the command, a second command to write information to the memory system; and
store data to the plurality of memory cells based at least in part on the second command.

20. The non-transitory computer-readable medium of claim 19, wherein the instructions, when executed by the processing circuitry of the electronic device, cause the electronic device to:
encode the data based at least in part on a third address identifier associated with the second command, wherein storing the data comprises storing the encoded data.

21. A method, comprising:
receiving a command to read data from a memory system;
determining a first address identifier, a transfer length, and a task tag based at least in part on the command;
reading a plurality of memory cells of a memory array of the memory system based at least in part on the command;
determining a second address identifier based at least in part on reading the plurality of memory cells;
determining whether the second address identifier is within a range of the first address identifier based at least in part on the transfer length and the task tag; and
responding to the command based at least in part on determining whether the second address identifier is within the range of the first address identifier.

22. The method of claim 21, further comprising:
storing an indication of the first address identifier, an indication of the transfer length, and an indication of the task tag in a second plurality of memory cells of a second memory array of the memory system, wherein determining whether the second address identifier is within the range of the first address identifier is based at least in part on the indication of the first address identifier, the indication of the transfer length, and the indication of the task tag stored in the second plurality of memory cells.

23. The method of claim 21, wherein responding to the command comprises:
transmitting data associated with the plurality of memory cells based at least in part on determining that the second address identifier is within the range of the first address identifier.

24. The method of claim 21, wherein responding to the command comprises:
refraining from transmitting data associated with the plurality of memory cells based at least in part on determining that the second address identifier is not within the range of the first address identifier.

25. The method of claim 21, wherein responding to the command comprises:
transmitting an error indication based at least in part on determining that the second address identifier is not within the range of the first address identifier.

* * * * *